(12) United States Patent
Hara et al.

(10) Patent No.: US 8,917,017 B2
(45) Date of Patent: Dec. 23, 2014

(54) ORGANIC EL PANEL, PANEL-COMBINED LIGHT EMITTING DEVICE, AND METHOD OF MANUFACTURING ORGANIC EL PANEL

(75) Inventors: Zenichiro Hara, Tokyo (JP); Satoru Kiridoshi, Tokyo (JP); Suguru Nagae, Tokyo (JP); Takanori Okumura, Tokyo (JP); Shintaro Yamasaki, Tokyo (JP); Yuji Saito, Yamagata-ken (JP); Yutaka Saito, Yamagata-ken (JP); Masashi Fukuzaki, Yamagata-ken (JP); Masami Kimura, Yamagata-ken (JP)

(73) Assignees: Tohoku Pioneer Corporation, Yamagata-ken (JP); Mitsubishi Electric Corporation, Tokyo (JP)

( * ) Notice: Subject to any disclaimer, the term of this patent is extended or adjusted under 35 U.S.C. 154(b) by 127 days.

(21) Appl. No.: 12/719,773

(22) Filed: Mar. 8, 2010

(65) Prior Publication Data

US 2011/0080089 A1 Apr. 7, 2011

(30) Foreign Application Priority Data

Oct. 5, 2009 (JP) ................................. 2009-231479

(51) Int. Cl.
*H05B 33/04* (2006.01)
*H01L 51/52* (2006.01)
*H01L 23/10* (2006.01)

(52) U.S. Cl.
CPC ............ *H01L 51/5237* (2013.01); *H01L 23/10* (2013.01); *H01L 2924/12044* (2013.01); *H01L 2924/0002* (2013.01)
USPC .......................................... 313/512; 313/292

(58) Field of Classification Search
USPC ................................................ 313/512, 292
See application file for complete search history.

(56) References Cited

U.S. PATENT DOCUMENTS

2003/0057177 A1 3/2003 Dutton et al.
2003/0209980 A1* 11/2003 Sasatani et al. ............... 313/553
(Continued)

FOREIGN PATENT DOCUMENTS

CN 1849022 A 10/2006
EP 1903626 A2 3/2008
(Continued)

OTHER PUBLICATIONS

Office Action issued in corresponding Japanese Application No. 2009-231479 dated Apr. 30, 2013, and English translation thereof (14 pages).

(Continued)

*Primary Examiner* — Andrew Coughlin
(74) *Attorney, Agent, or Firm* — Osha Liang LLP

(57) ABSTRACT

For organic EL panels with a hollow-sealed structure to meet the demand of flat or large displays, the inconvenience of contact of drying anent etc touching the organic EL elements in the sealed space is avoided. An organic EL panel includes a panel substrate, a light-emitting part with a plurality of organic EL elements having an anode, an organic layer and a cathode laminated on the panel substrate, and a sealing substrate configured to be bonded onto the panel substrate through an adhesive layer to seal the light-emitting part. The sealing substrate includes a supporting projection projecting toward the panel substrate. A supporting margin facing to the bottom face of the supporting projection is provided where the organic EL elements is not formed within a region of the light-emitting part on the panel substrate.

11 Claims, 12 Drawing Sheets

(56) References Cited

U.S. PATENT DOCUMENTS

| | | | | |
|---|---|---|---|---|
| 2005/0140291 | A1* | 6/2005 | Hirakata et al. | 313/512 |
| 2005/0255782 | A1* | 11/2005 | Park et al. | 445/25 |
| 2006/0202617 | A1* | 9/2006 | Yamada | 313/512 |
| 2007/0046198 | A1 | 3/2007 | Kuan et al. | |
| 2007/0229392 | A1* | 10/2007 | Lee et al. | 345/1.1 |
| 2007/0290609 | A1 | 12/2007 | Ishii et al. | |
| 2008/0074035 | A1* | 3/2008 | Woo et al. | 313/504 |

FOREIGN PATENT DOCUMENTS

| | | |
|---|---|---|
| JP | 2006-253097 A | 9/2006 |
| JP | 2007-335365 | 12/2007 |
| KR | 10-0838079 B1 | 6/2008 |
| WO | 2006/101378 A1 | 9/2006 |
| WO | 20081139746 A1 | 11/2008 |

OTHER PUBLICATIONS

English abstract of Korean Publication No. 100838079 published on Jun. 13, 2008, 1 page.

Patent Abstracts of Japan, Publication No. 2006-253097, Published on Sep. 21, 2006, 1 page.

First Office Action issued in corresponding Chinese Application No. 201010129707.4 dated Jul. 4, 2012, and English translation thereof (18 pages).

English abstract of Chinese Publication No. 1849022 published on Oct. 18, 2006, 1 page.

Second Office Action issued in corresponding Chinese Application No. 201010129707.4 dated Mar. 28, 2013, and English translation thereof (16 pages).

English Abstract from espacenet for patent No. JP2007335365, Publication Date: Dec. 27, 2007, 1 page.

Office Action issued in corresponding U.S. Appl. No. 13/420,985 dated Nov. 21, 2013 (7 pages).

* cited by examiner (a)

(b)

A-A (c)

B-B (a)

(b)

(a)

(b)

(c)

(d)

F I G. 7
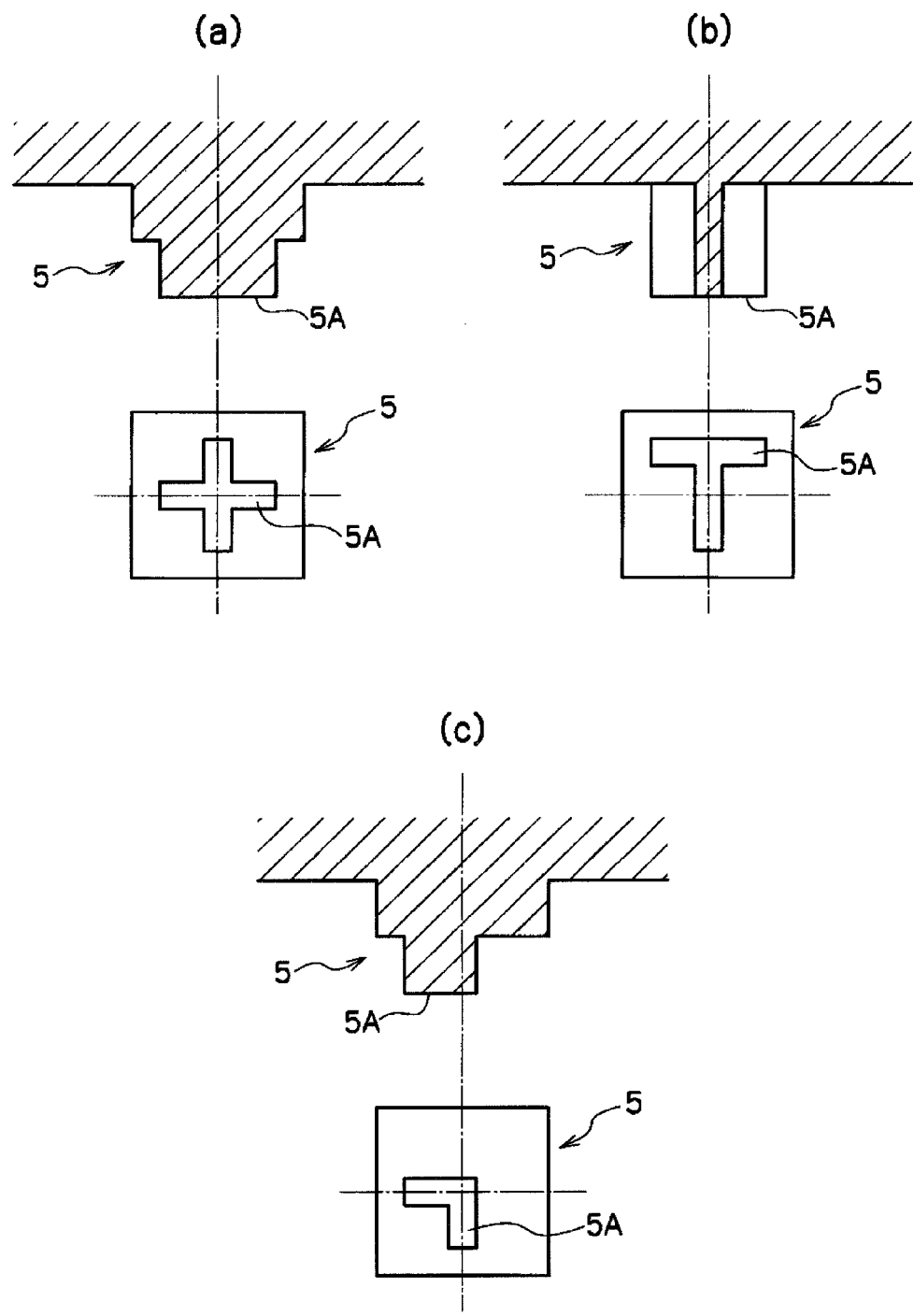

(a)

(b)

(a)

(b)

Enlarged view of part A (a)

(b)

ORGANIC EL PANEL, PANEL-COMBINED
LIGHT EMITTING DEVICE, AND METHOD
OF MANUFACTURING ORGANIC EL PANEL

FIELD OF THE INVENTION

The invention is related to an organic EL panel, a panel-combined light-emitting device, and a method of manufacturing the organic EL panel.

BACKGROUND OF THE INVENTION

The organic EL panel is a self-emission panel provided with an organic EL element as a light-emitting element. For example, the organic EL panel is used for display screens of mobile phones, monitor screens of electronic devices in automobiles or for family use, and information display screens of PCs and TVs. The organic EL panel is also used for various types of display devices such as advertising light-emitting panels, various types of light sources in scanners and printers, and illuminating devices such as generally-used lighting systems and back-lighting of LCDs. Further, the organic EL panel is available for various applications and devices such as optical communication devices using the photoelectric conversion function.

Since the light-emission properties of organic EL elements deteriorate when exposed to moisture, etc., a sealing structure for separating the organic EL element from the atmosphere is inevitable in order to use an organic EL panel for a long time in a stable condition. As one example for sealing the organic EL element, a hollow-sealed structure is known in which a sealing substrate is bonded to a panel substrate having the organic EL element to form a sealing space for housing the organic EL element and to place a drying agent in the sealing space.

FIG. 1 is a schematic view showing a conventional hollow-sealed structure having the above-mentioned sealing space of the organic EL panel. FIG. 1(a) is a plan view, FIG. 1(b) is a sectional view taken along line A-A of FIG. 1(a), and FIG. 1(c) is a sectional view taken along line B-B of FIG. 1(a). The organic EL element, being a light-emitting element is formed on a panel substrate J1 (not shown). A sealing substrate J2 is bonded to the panel substrate J1 through an adhesive layer J3 to make a sealing space is for housing the light-emitting element. The sealing substrate J2 has a concave portion J4 to make the sealing space Js. On the inner surface of the concave portion J4, a drying agent J5 is placed to absorb the moisture in the sealing space Js. Further, a thick rib J6 is formed on the concave portion 14 of the sealing substrate J2 in order to reinforce the sealing substrate 12 (see the following patent literature reference 1).

PRIOR ART

Patent Literature

PATENT LITERATURE REFERENCE 1: Japanese laid-open patent publication 2007-335365

SUMMARY OF THE INVENTION

In an organic EL panel having the above-mentioned hollow-sealed structure with a sealing space, if an external force pressing the sealing substrate or bending the panel substrate is applied to the organic EL panel, the adhesive connecting the sealing substrate to the panel substrate may be inconveniently removed. As organic EL panels are getting thinner than ever in accordance with social needs, the sealing substrate is also required to be thinner, thus the panel substrates and sealing substrates become easier to bend. Accordingly, when responding to the social demand for thinner and larger-sized screens, the deterioration of sealing performance caused by the removal of the adhesive and the contact between the drying agent and the organic EL element are becoming more widely recognized.

In the prior art as described above, a reinforcing rib is provided on the sealing substrate to prevent its deformation. However, responding to the demand of thinner and larger-sized screens, it is difficult to prevent the deformation so as not to cause any problem even if the conventional reinforcing rib is provided. The edge of the reinforcing rib contacts and destroys the organic EL element due to a limited distance between the edge of the rib and the organic EL element.

One or more embodiments of the present invention prevent deterioration of the sealing performance caused by removal of an adhesive due to an external force and contact between the edge of the rib and the organic EL element in the sealing space for the EL panel having a hollow-sealed structure. More specifically, one or more embodiments of the present invention prevent deterioration of the sealing performance, while maintaining a quality display performance, when configuring a large-sized panel (tiling panel) with a plurality of organic EL panels planarly jointed to each other.

One or more embodiments of the present invention includes at least the following elements.

In general, according to one aspect of the present invention, an organic EL panel includes a panel substrate; a light-emitting part including a plurality of organic EL elements having an anode, an organic layer and a cathode laminated on the panel substrate; and a sealing substrate configured to be bonded onto the panel substrate through an adhesive layer to hollow-seal the light-emitting part. The sealing substrate includes a supporting projection projecting toward the panel substrate, and a supporting margin facing a bottom face of the supporting projection is provided where the organic EL elements are not formed within a region of the light-emitting part on the panel substrate.

In general, according to another aspect of the present invention, a panel-combined light-emitting device has a plurality of organic EL panels planarly jointed to each other to make a large-sized panel. The organic EL panel includes a panel substrate and a light-emitting part including a plurality of organic EL elements having an anode, an organic layer and a cathode laminated on the panel substrate, and a sealing substrate configured to be bonded onto the panel substrate through an adhesive layer to hollow-seal the light-emitting part. The sealing substrate includes a supporting projection projecting toward the panel substrate. A supporting margin facing a bottom face of the supporting projection is provided where the organic EL elements are not formed within a region of the light-emitting part on the panel substrate. The light-emitting part is configured with a plurality of pixel blocks, each of which has a plurality of organic EL elements, while the supporting margin is configured between the pixel blocks. The distance between the pixel blocks is defined in accordance with the distance between the adjacent light-emitting parts of the organic EL panels.

In general, according to another aspect of the present invention, a method of manufacturing an organic EL panel includes forming a light-emitting part having at least one organic EL element on a panel substrate, forming a concave portion for housing the light-emitting part on a sealing substrate, and sealing the light-emitting part by bonding the panel substrate and the sealing substrate together through an adhesive layer. A supporting projection projecting toward the panel substrate is formed while the concave portion is being formed. A supporting margin facing the bottom face of the supporting projection is provided where the organic EL elements are not formed within a region of the light-emitting part on the panel substrate.

BRIEF DESCRIPTION OF THE DRAWINGS

FIG. 1(a) is a plan view, FIG. 1(b) is a sectional view taken along line A-A of FIG. 1(a), and FIG. 1(c) is a sectional view taken along line B-B of FIG. 1(a).

FIG. 2(a) is a vertically sectional view of the organic EL panel and FIG. 2(b) is a sectional view taken along line X-X.

FIGS. 7(a), 7(b), and 7(c) are views (plan view and sectional view) illustrating still another typical form of a supporting projection provided on the organic EL panel according to one embodiment of the present invention.

FIG. 9(a) shows an example of an active drive element with a separate pixel electrode, while FIG. 9(b) shows an example of a passive drive element where an element is formed on a crossover portion of crossing stripe-patterned electrodes.

DETAILED DESCRIPTION OF THE INVENTION

Figure 1:
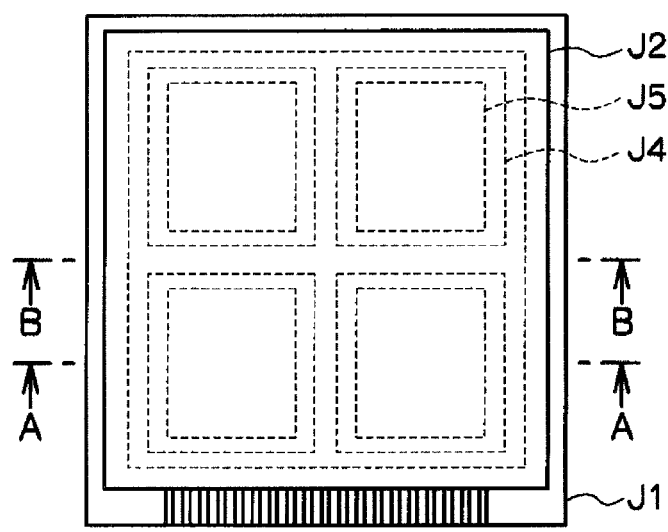
FIG. 1 is a view illustrating a prior art.
Figure 1:
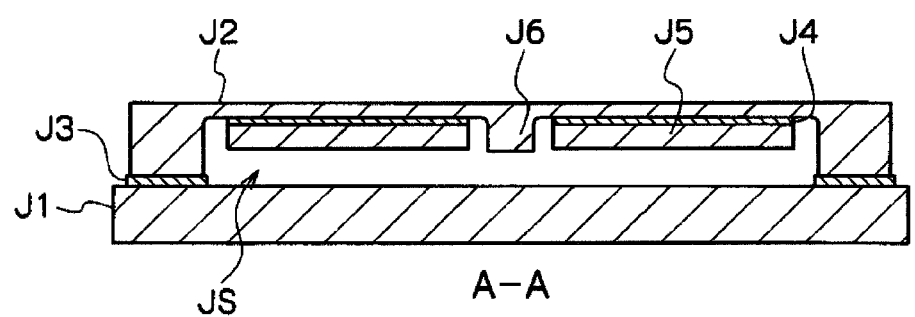
Figure 1:
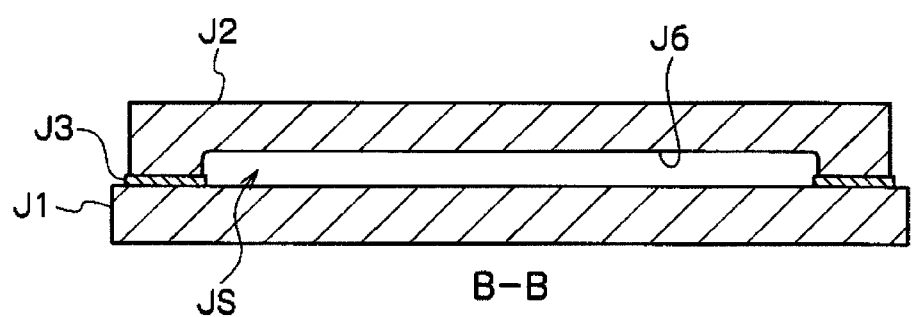
Figure 2:
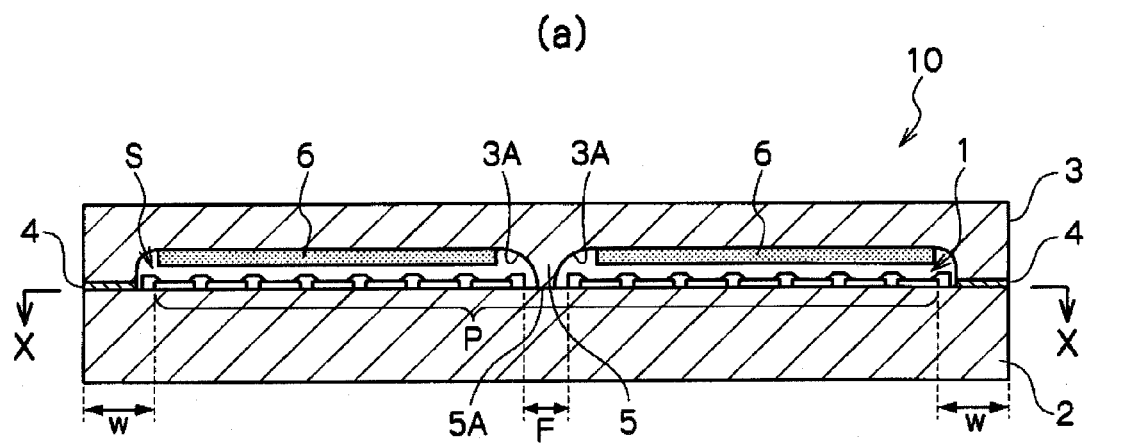
FIG. 2 is a view illustrating a organic EL panel according to one embodiment of the present invention.
Figure 2:
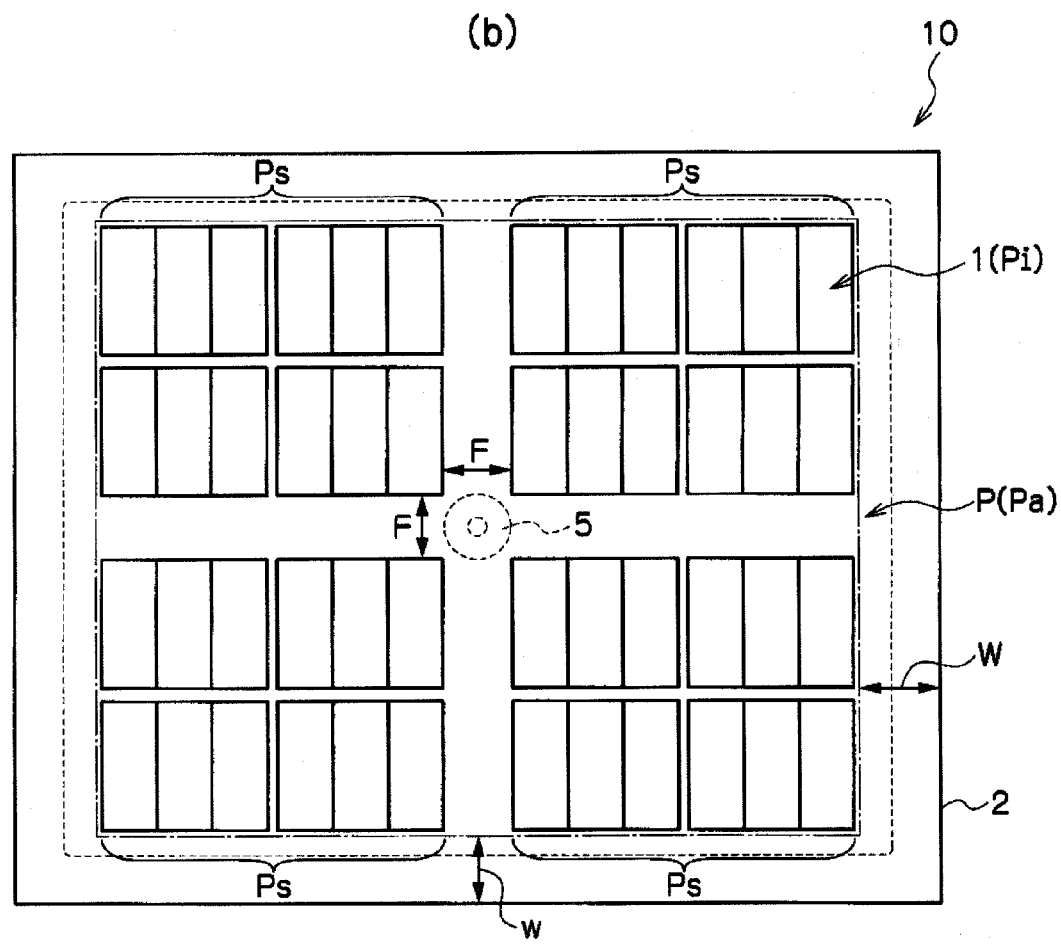

Hereinafter, the embodiments of the present invention are described with reference to the drawings. FIG. 2 is a view illustrating a organic EL panel according to one embodiment of the present invention. FIG. 2(a) is a vertically sectional view of the organic EL panel and FIG. 2(b) is a sectional view taken along the line X-X. The organic EL panel 10 is provided with a panel substrate 2, a light-emitting part P including a plurality of organic EL elements 1 formed on the panel substrate 2, and a sealing substrate 3 that is bonded to the panel substrate 2 through an adhesive layer 4 to seal the light-emitting part P in a sealing space. The sealing substrate is provided with a supporting projection 5 projecting toward the panel substrate 2. A supporting margin F facing a bottom face 5A of the supporting projection 5 is provided where the organic EL elements 1 are not formed within a region of the light-emitting part P (light-emitting region Pa) on the panel substrate 2.

The organic EL element 1 has a laminated structure in which an anode, an organic layer including a light-emitting layer, and a cathode laminated on the panel substrate 2. When applying a voltage between the anode and the cathode, the electrons injected from the cathode and the holes injected from the anode are recombined in the light-emitting layer, etc. to emit light. The organic EL panel 10 having the organic EL elements 1 formed on the panel substrate 2 that is made up of a light-transmissive material as shown in the drawings can emit light outward through the panel substrate 2 (bottom emission type). Alternatively, the organic EL panel 10 may emit light outward through a sealing substrate 3 as described later (top emission type) in an opposite direction to the bottom emission type. In addition, the organic EL panel 10 may emit light outward from both surfaces of the panel substrate 2 and the sealing substrate 3 (dual emission type).

The plurality of organic EL elements 1 formed on the panel substrate 2 constitutes the light-emitting part P. In the example shown in FIG. 2(b), the organic EL elements 1, being respective pixels Pi, are arranged in a matrix in a plane. Further, the light-emitting part P has a plurality of pixel blocks Ps, each of which includes a plurality of the organic EL elements 1 (pixels Pi). The supporting margin F is configured between two pixel blocks Ps.

The panel substrate 2 is made of a transparent material such as glass and plastic. The opposite side to the surface to which the sealing substrate 3 is bonded is a light emission side. The sealing substrate 3 is bonded to the panel substrate 2 to make the sealing space S housing the light-emitting part P. The sealing substrate 3 is provided with a concave portion 3A to make the sealing space S in the example shown as shown in FIG. 2(a). However the sealing space S may be made by other methods, for example by inserting a spacer between the panel substrate 2 and the sealing substrate 3. As shown in the drawing, the concave portion 3A enables to provide a space to place a drying agent 6 on the inner surface of the concave portion 3A.

The organic EL panel 10 with a sealing space as shown above cannot use the entire surface of the panel substrate 2 as the light-emitting region Pa. The light-emitting region Pa is narrowed by the region for providing the adhesive layer 4, etc to bond the sealing substrate 3 to the panel substrate 2. The light-emitting region Pa of each organic EL panel 10 may be configured as broadly as possible by narrowing the marginal width w formed outside of the light-emitting part P in the organic EL panel 10.

The supporting projection 5 is formed on the sealing substrate 3 in the organic EL panel 10 corresponding to the light-emitting region Pa. The bottom face 5A of the supporting projection 5 may contact the panel substrate 2 either constantly or only at a time when the sealing substrate 3 or the panel substrate 2 are deformed. A supporting margin F facing a bottom face 5A of the supporting projection 5 is provided where the organic EL elements 1 are not formed within a region of the light-emitting part P (light-emitting region Pa)

on the panel substrate 2. The supporting margin F may be defined on the exposed region of the panel substrate 2 or on the region where the peripheral part (insulating film, etc.) of the organic EL elements 1 is formed. Alternatively, the bottom face 5a of the supporting projection 5 may be fixed on the panel substrate 2 with a adhesive as necessary.

Since the above-mentioned supporting projection 5 projects from the inner surface of the sealing substrate 3 toward the panel substrate 2 with a predetermined height, it is possible to expediently prevent the drying agent, etc. provided on the sealing substrate 3 from contacting the organic EL elements 1 with the supporting projection 5 functioning as a stopper, even when the sealing substrate 3 and the panel substrate 2 are curved and deformed. In one or more embodiments, as the drying agent 6 is placed on the inner surface of the sealing substrate 3, the height of the supporting projection 5 from the inner surface of the sealing surface 3 is needed to be greater than the thickness of the drying agent 6. When the drying agent 6 is placed on the inner surface of the concave portion 3A provided on the inner surface of the sealing substrate 3, the supporting projection 5 is configured to project from the inner surface of the concave portion 3A and its height from the inner surface of the concave portion 3A needs to be greater than the thickness of the drying agent 6.

FIGS. 3 to 7 are views (plan view and sectional view) illustrating typical forms of the supporting projection 5 provided on the organic EL panel 10 according to one embodiment of the present invention. The section of the supporting projection 5 perpendicular to the panel substrate 2 is configured to have a shape that its width is thick near the sealing substrate 3 and is thin on the bottom face 5A near the panel substrate 2. The form of the supporting projection 5 as shown above may prevent the supporting projection 5 from being broken or fractured, even when the supporting projection 5 is subject to a pressure with the bottom face 5A of the supporting projection 5 coming into contact with the panel substrate 2. In addition, non-emission portion within the light-emitting region Pa may be minimized because the supporting margin F becomes smaller as the bottom face 5A becomes thinner.

Figure 3:
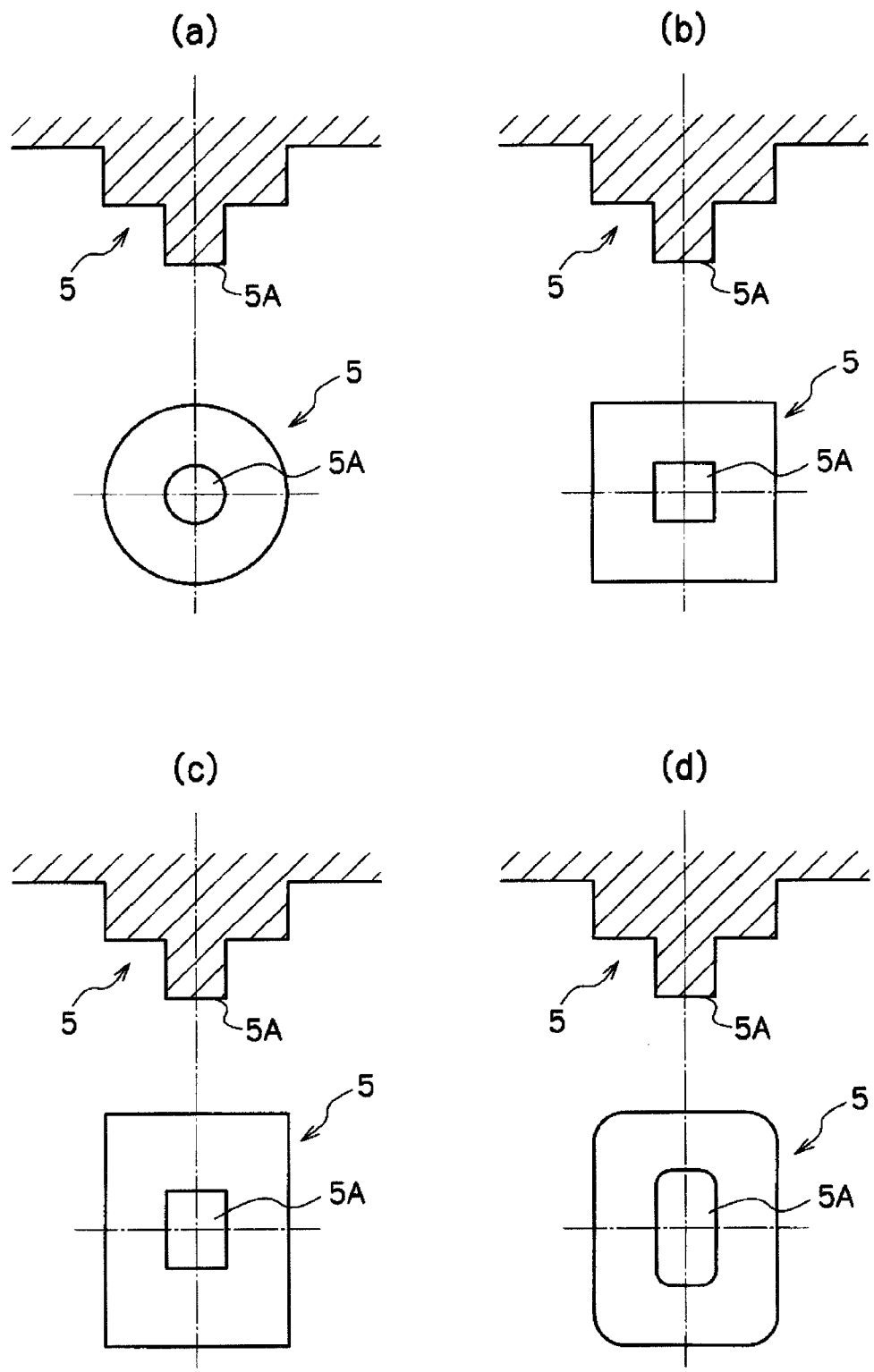
FIGS. 3(a), 3(b), 3(c), and 3(d) are views (plan view and sectional view) illustrating a typical form of a supporting projection provided on the organic EL panel according to one embodiment of the present invention.

The typical cross-sectional shape of the supporting projection 5 perpendicular to the panel substrate 2 is configured to have two widths as shown in FIG. 3. FIG. 3(a) shows the supporting projection 5 having a circular section, FIG. 3(b) shows its square-shaped section, FIG. 3(c) shows its rectangular section and FIG. 3(d) shows its rectangular section with round corners or oval-shaped section, respectively.

Figure 4:
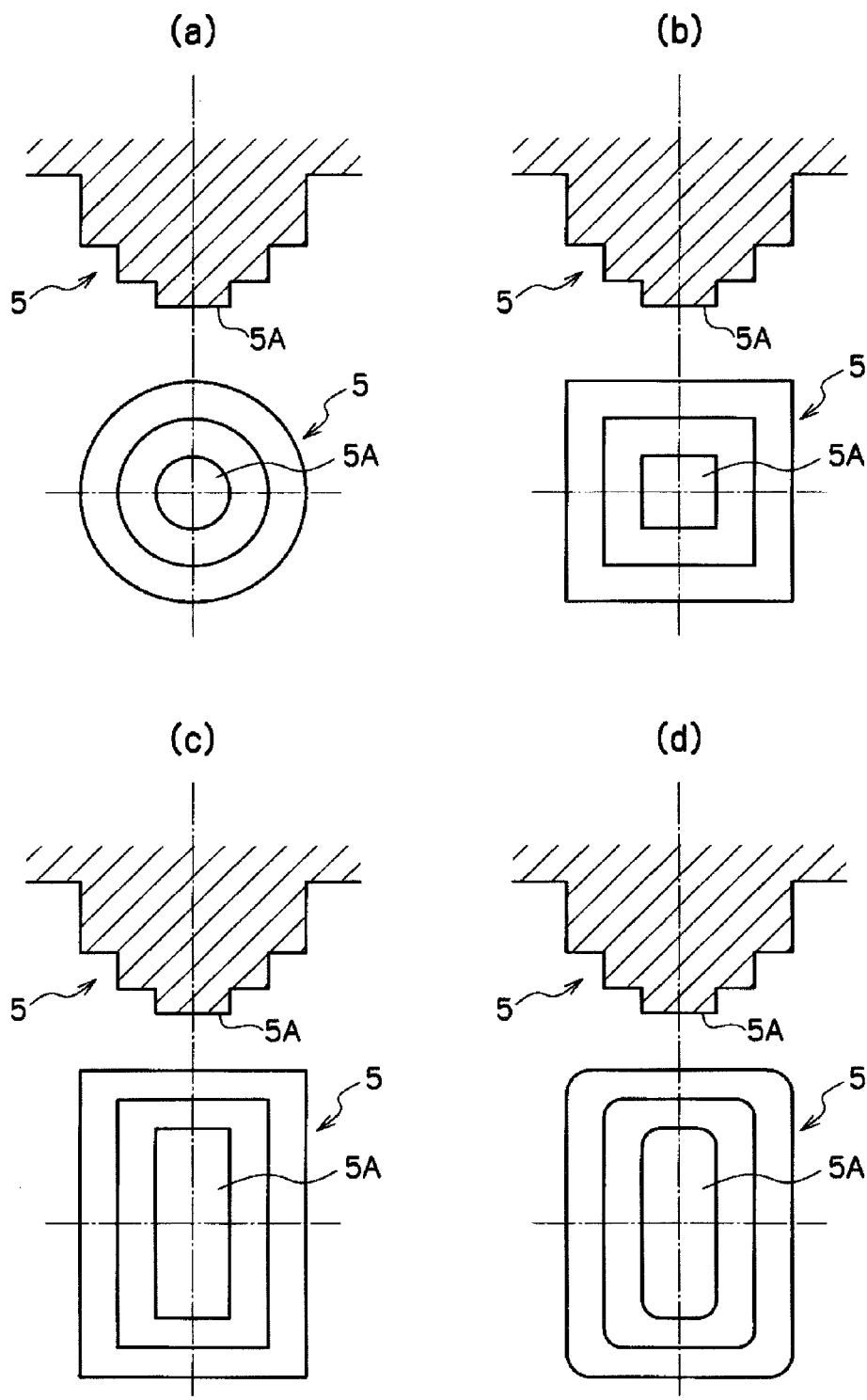
FIGS. 4(a), 4(b), 4(c), and 4(d) are views (plan view and sectional view) illustrating another typical form of the supporting projection provided on the organic EL panel according to one embodiment of the present invention.

The typical cross-sectional shape of the supporting projection 5 perpendicular to the panel substrate 2 is configured to have multi-stage widths (three stages) as shown in FIG. 4. FIG. 4(a) shows the supporting projection 5 having a circular section, FIG. 4(b) shows its square-shaped section, FIG. 4(c) shows its rectangular section and FIG. 4(d) shows its rectangular section with round corners or oval-shaped section, respectively.

Figure 5:
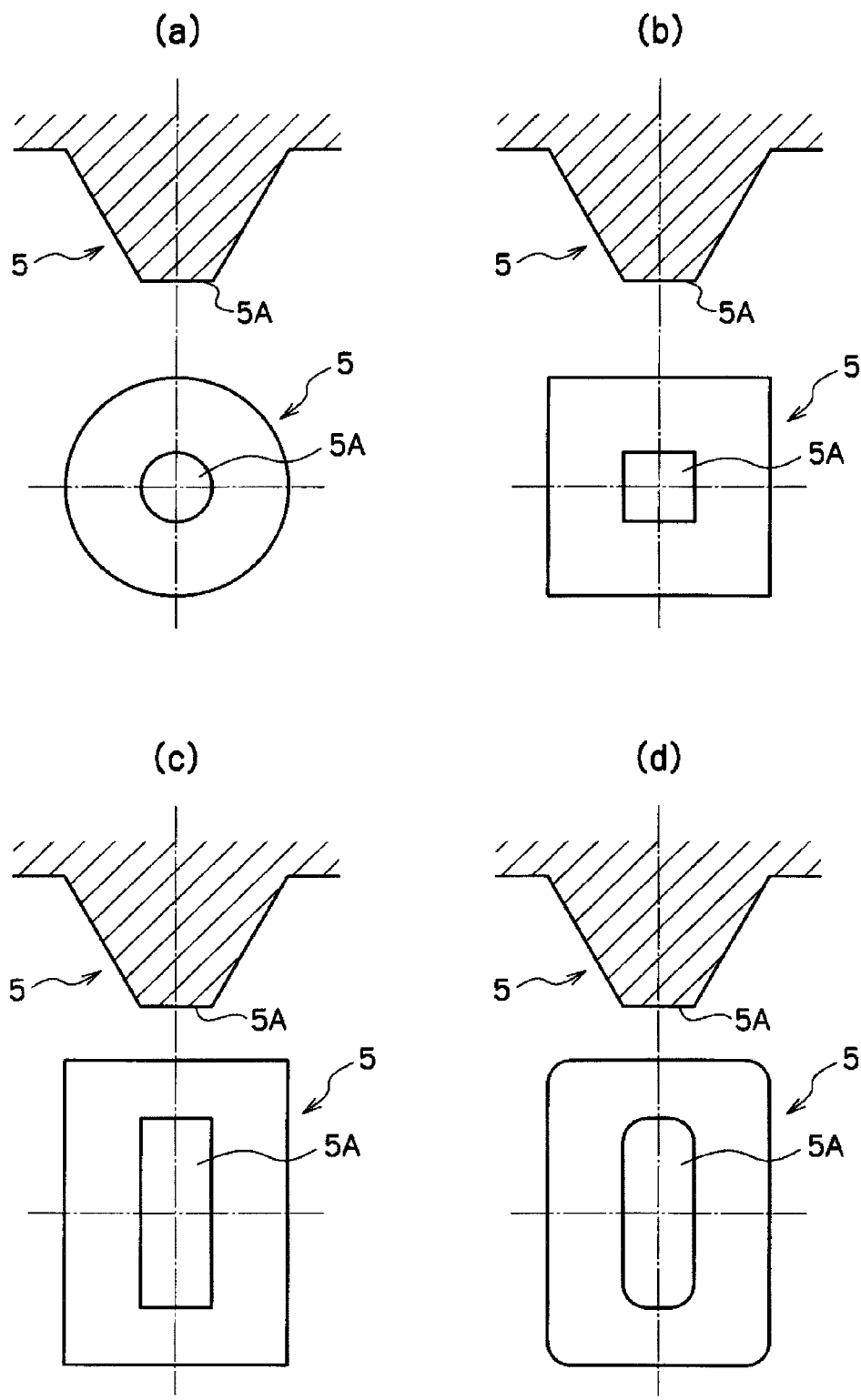
FIGS. 5(a), 5(b), 5(c), and 5(d) are views (plan view and sectional view) illustrating still another typical form of a supporting projection provided on the organic EL panel according to one embodiment of the present invention.

The typical cross-sectional shape of the supporting projection 5 perpendicular to the panel substrate 2 is configured to be trapezoid as shown in FIG. 5. FIG. 5(a) shows the supporting projection 5 having a circular section, FIG. 5(b) shows its square-shaped section, FIG. 5(c) shows its rectangular section and FIG. 5(d) shows its rectangular section with round corners or oval-shaped section, respectively.

Figure 6:
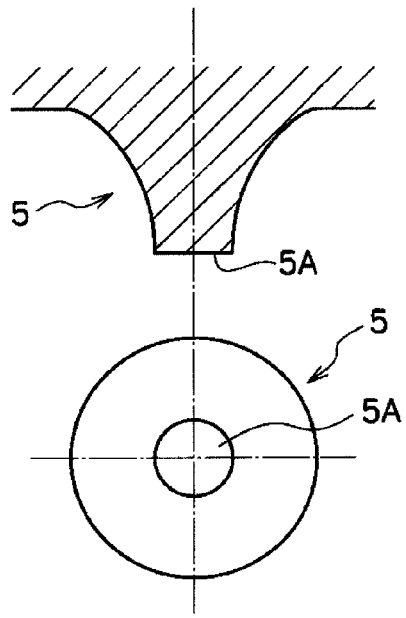
FIGS. 6(a), 6(b), 6(c), and 6(d) are views (plan view and sectional view) illustrating still another typical form of a supporting projection provided on the organic EL panel according to one embodiment of the present invention.
Figure 6:
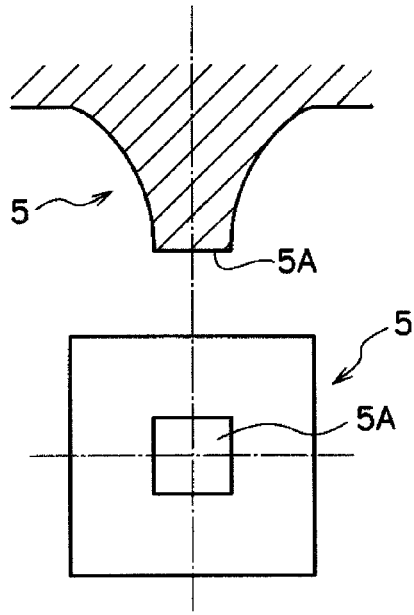
Figure 6:
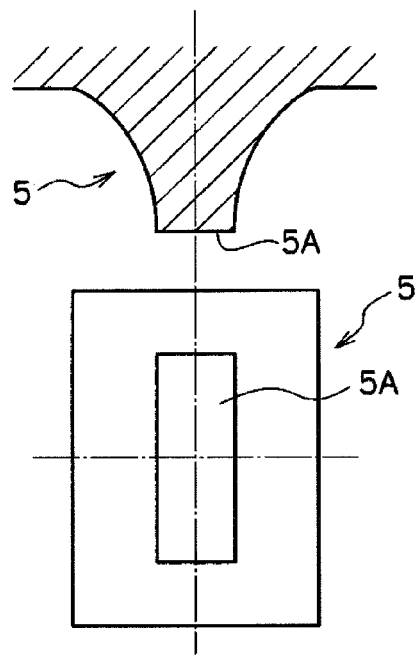
Figure 6:
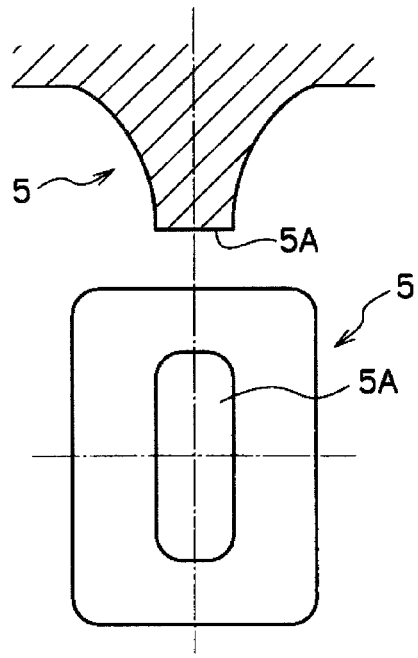

The typical cross-sectional shape of the supporting projection 5 perpendicular to the panel substrate 2 is configured to be tapered as shown in FIG. 6. FIG. 6(a) shows the supporting projection 5 having a circular section, FIG. 6(b) shows its square-shaped section, FIG. 6(c) shows its rectangular section and FIG. 6(d) shows its rectangular section with round corners or oval-shaped section, respectively.

The typical cross-sectional shape of the supporting projection 5 perpendicular to the panel substrate 2 is configured to have a stepped section as shown in FIG. 7. FIG. 7(a) shows the supporting projection 5 having a cross-shaped section, FIG. 7(b) shows its T-shaped section, and FIG. 7(c) shows its angle-shaped section, respectively.

Figure 8:
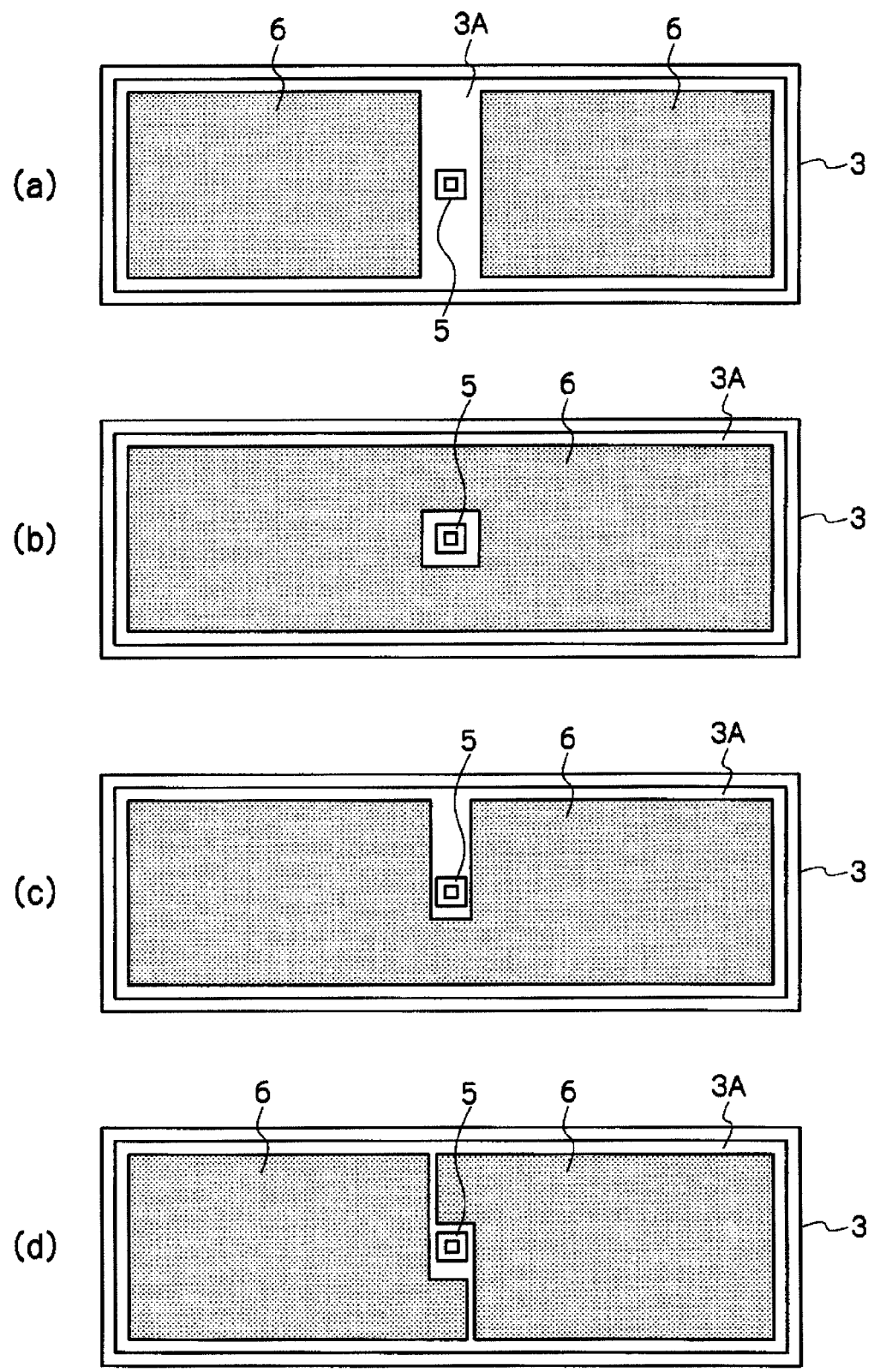
FIGS. 8(a), 8(b), 8(c), and 8(d) are views illustrating an example of placement of a drying agent placed on the inner surface of a concave portion in the sealing substrate.

FIG. 8 is a view illustrating an example of placement of the drying agent 6 placed on the inner surface of a concave portion 3A in the sealing substrate 3. The drying agent 6 may be placed on both sides of the supporting projection 5 formed on the inner surface of the concave portion 3A as shown in FIG. 8(a). Further, the drying agent 6 may be placed on the entire inner surface except around the supporting projection 5 as shown in FIG. 8(b). Moreover, the drying agent 6 may be placed substantially on the entire inner surface with a cutout having a width corresponding to the supporting projection 5 as shown in FIG. 8(c). Alternatively, the drying agent 6 may be placed on both sides of the supporting projection 5 without making the cutout corresponding to the width of the supporting projection 5 as shown in FIG. 8(d). The drying agent 6 being place on the inner surface of the concave portion 3A of the sealing substrate 3 with a minimized vacant space, the sealing space S may be effectively sealed.

The supporting projection 5 when formed on a spot of the inner surface of the sealing substrate 3 may function to protect the organic EL elements 1 as described above. If a single supporting projection 5 is placed on a single spot, the center of the sealing substrate 3 is the most effective spot. Alternatively, a plurality of supporting projections 5 may be placed on the inner surface of the sealing substrate 3. Further, the supporting projection 5 may be placed not on spots, but linearly. In one or more embodiments, if the supporting projection is placed on multiple spots or linearly, the supporting margin F is required to be formed on the panel substrate 2 corresponding to the bottom face 5A.

Hereinafter, a method of manufacturing the organic EL panel 10 having the above-mentioned features is described. The method of manufacturing the organic EL panel 10 includes a light-emitting part forming step of forming a light-emitting part P having at least one organic EL element 1 on the panel substrate 2, a sealing substrate processing step of processing the sealing substrate 3 with the concave portion 3A for housing the light-emitting part P, and a sealing step of sealing the light-emitting part P within the sealing space S by adhering the sealing substrate 3 to the panel substrate 2 through adhesive layer 4.

In the sealing substrate processing step, the supporting projection 5 is formed to project toward the panel substrate 2 while the concave portion 3A is formed. In the light-emitting part forming step, the supporting margin F is formed where the organic EL element 1 is not formed facing the bottom face 5A of the support projection 5 within a region of the light-emitting part P on the panel substrate 2.

Figure 9:
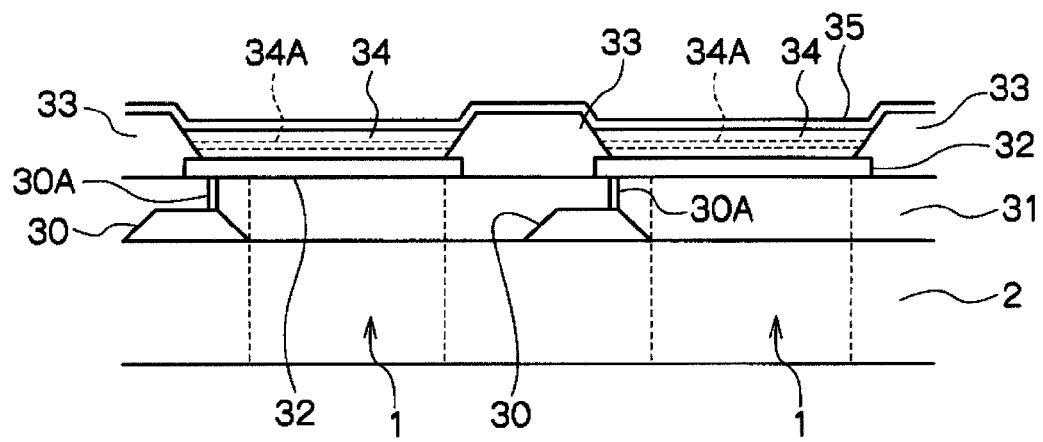
FIG. 9 is a view illustrating an example of the organic EL element formed in the light-emitting part forming step.
Figure 9:
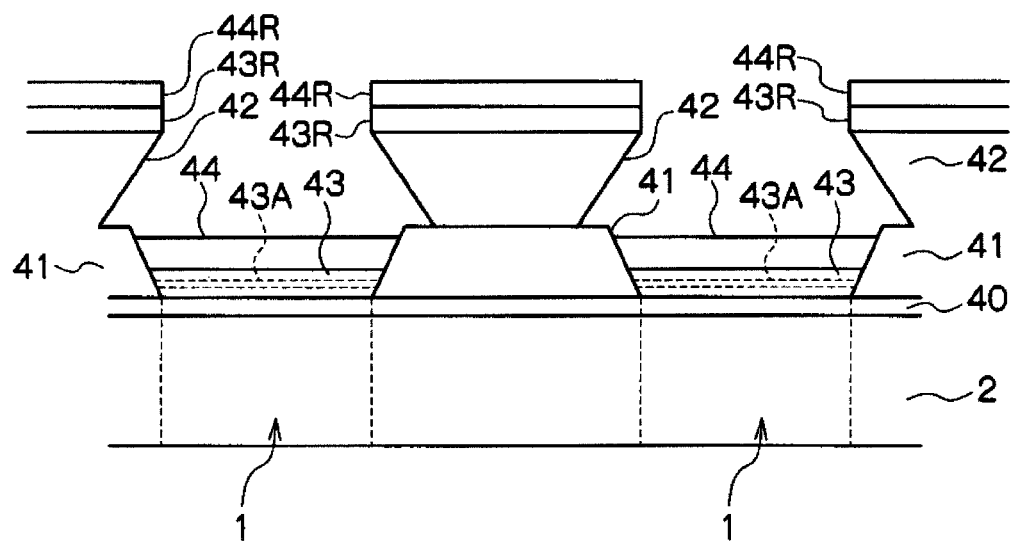

FIG. 9 is a view illustrating an example of the organic EL element 1 formed in the light-emitting part forming step. FIG. 9(a) shows an example of an active drive element with a separate pixel electrode, while FIG. 9(b) shows an example of a passive drive element where an element is formed on a crossover portion of crossing stripe-patterned electrodes.

In the example shown in FIG. 9(a), a drive element 30 (TFT, etc.) is formed on the panel substrate 2. A planarized film 31 is formed to cover the drive element 30. And, a lower electrode 32, being a pixel electrode is formed on the planarized film 31. The lower electrode 32 can be formed by patterning in a photolithography process after forming a film of an electrode material on the planarized film 31. A connecting conductor 30A is formed to connect the lower electrode 32 to the drive element 30 and an insulating film 33 is formed at the periphery thereof before forming the lower electrode 32. An organic layer 34 including a light-emitting layer 34A is formed to cover an opening pattern of the insulating film 33 on the lower electrode 32. The organic layer 34 is mask-evaporated with a mask opening aligned with the opening of the insulating film 33. Subsequently, an upper electrode 35 is formed to cover the entire organic layer 34.

In the example shown in FIG. 9(b), a lower electrode 40 is formed on the panel substrate 2 in a stripe pattern. An insulating film 41 is formed on the lower electrode 40 to make a stripe pattern so as to cross the lower electrode 40. Further, a partition 42 is formed in a stripe pattern on the insulating film 41 as necessary. The partition 42 may be downwardly-tapered. An organic layer 43 including a light-emitting layer 43A is formed along the stripe-patterned opening of the insulating film 41 and the partition 42. An upper electrode 44 in a stripe pattern is formed on the organic layer 43. The partition 42 serves as a mask pattern when forming the upper electrode 44. When forming films of the organic layer 43 and the upper electrode 44 thereon, an organic material deposited layer 43R and an upper electrode material deposited layer 44R are laminated on the top surface of the partition 42.

Hereinafter, an example of forming the organic layers 34 and 43 is described with the lower electrodes 32 and 40 as anodes while the upper electrodes 35 and 44 as cathodes. The lower electrodes 32 and 40 are formed by a transparent electrode such as ITO. A hole-injecting layer made of copper phthalocyanine (CuPc), etc. is formed on the lower electrodes 32 and 40 and NPB (N,N-di(naphtalence)-N,N-dipheneyl-benzidene), etc. is formed thereon as a hole transport layer. The hole transport layer functions to transport holes injected from the lower electrodes 32 and 40 to the light-emitting layers 34A and 43A. The hole transport layer may be configured with one layer or more than one layer. Further, the hole transport layer may not necessarily be formed of a single material. A single hole transport layer may be formed of plural materials. A host material having a high capacity of charge transport may be doped with a guest material having high charge-donating (-accepting) properties.

Next, the light-emitting layers 34A and 43A are formed on the hole transport layer. As one example, by using a resistance-heating evaporation method, the light-emitting layers 34A and 43A corresponding to Red, Green and Blue are formed on the respective formation regions by using masks for respective colors. An organic material emitting a red light such as a styryl pigment is used for red color such as DCM1 (4-(dicyanomethylene)-2-methyl-6-(4'-dimethylami-nostyryl)-4H-pyrane). Further, an organic material emitting a green light such as Alq3 is used for green color. Furthermore, an organic material emitting a blue light such as distyryl derivative and triazole derivative is used for blue color. Other materials including a layer structure with host-guest group system may be used. For the light-emitting layer, a fluorescent material or a phosphorescent material may be used.

An electron transport layer formed on the light-emitting layers 34A and 43A are produced according to various thin-film formation methods such as the resistance-heating evaporation method, by using various materials, for example Alq3. The electron transport layer functions to transport electrons injected from the upper electrodes 35 and 44 to the light-emitting layers 34A and 43A. The electron transport layer may be configured with one layer or more than one layer. Further, the electron transport layer may not necessarily be formed of a single material. A single electron transport layer may be formed of plural materials. A host material having a high capacity of charge transport may be doped with a guest material having high charge-donating (-accepting) properties.

The insulating film 33 and 41 and the partition 42 are composed of a polyimide or a resist material. In the case that the upper electrodes 35 and 44 function as a cathode, a material with lower work function than an anode is employed. For example, if ITO is used as the anode, aluminum (Al) or a magnesium alloy (Mg—Ag) may be employed for the cathode. However, as Al does not have so high an electron injection efficiency, an electron injection layer such as LiF may be provided between Al and the electron transport layer.

In order to form the above-mentioned supporting margin F in the light-emitting part forming step, the interval of the lower electrodes 32 arranged in a matrix is made to be broader than others in every several rows in the active drive method as shown in FIG. 9 (a). In the passive drive method as shown in FIG. 9 (b), the interval of the lower electrodes 40 arranged in a stripe pattern is made to be broader than others in every several rows.

Figure 10:
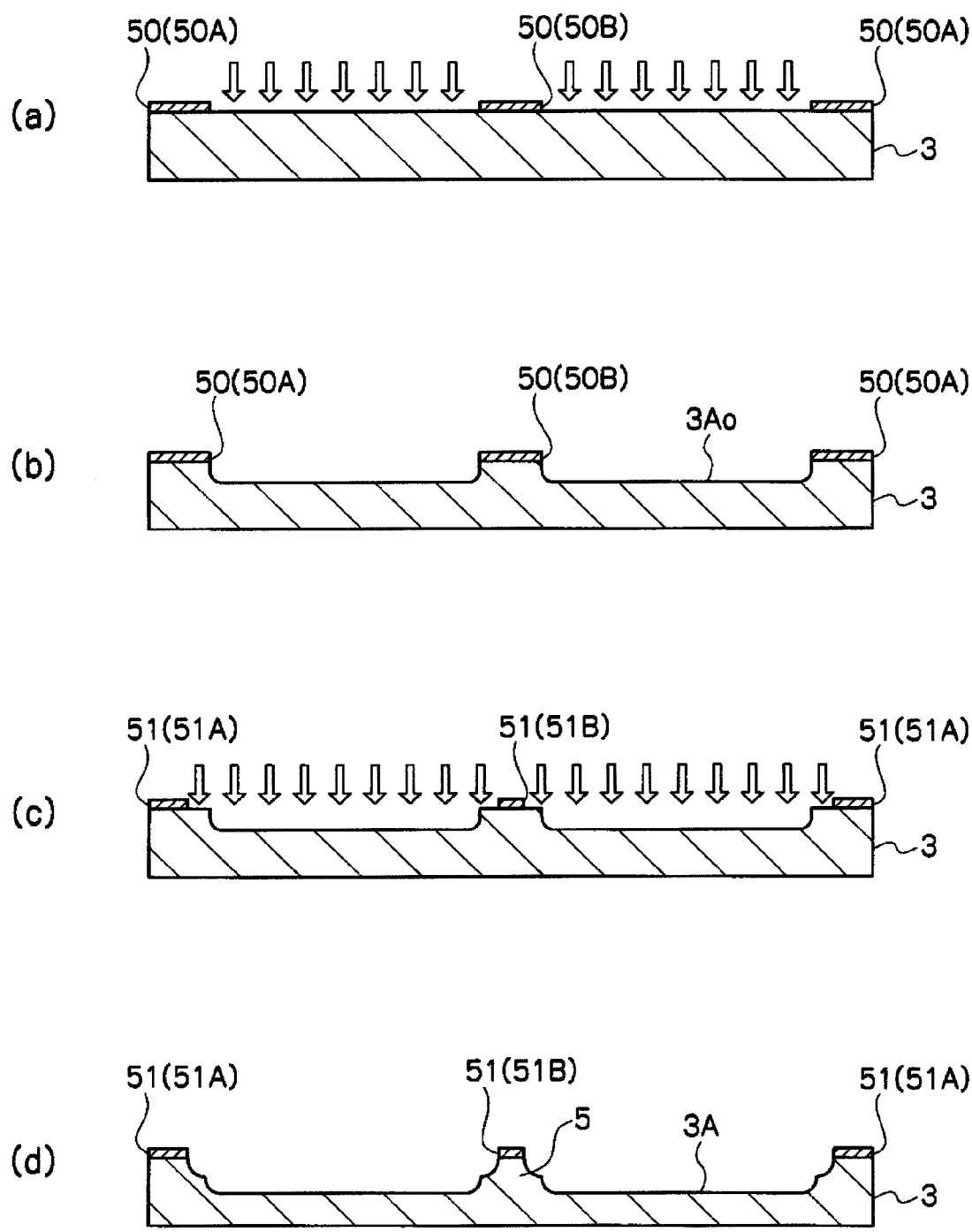
FIGS. 10(a), 10(b), 10(c), and 10(d) are views illustrating an example of the sealing substrate processing step according to one embodiment of the present invention.

FIG. 10 is a view illustrating an example of the sealing substrate processing step. The concave portion 3A and the supporting projection 5 that are formed by etching on the sealing substrate 3 are shown here. The etching process includes a first etching process for etching the inner surface of the sealing substrate 3 with a resist pattern formed in a forming area of the supporting projection 5 and a second etching process for etching the inner surface of the sealing substrate 3 with a resist pattern formed in an area corresponding to the bottom face 5A of the supporting projection 5.

FIGS. 10(a) and 10(b) show the first etching process. The pattern of resist 50 formed on the inner surface of the sealing substrate 3 is formed so as to be open for an area smaller than the final etching area corresponding to the finally made concave portion 3A. The pattern of a resist 50B corresponding to the area in which the supporting projection 5 is formed is configured to mask an area larger than the forming area of the bottom face 5A of the supporting projection 5. Then, the inner surface of the sealing substrate 3 with the resist 50 applied as described above is processed by etching to make a provisional concave portion $3A_0$ having a depth more than half the depth of the finally made concave portion 3A.

FIGS. 10(c) and 10(d) show the second etching process. The pattern of resist 51 is formed to mask an area smaller than the resist 50 in the first etching process. The resist 51B formed corresponding to the area in which the supporting projection 5 is formed is formed to mask an area of the bottom face 5A of the supporting projection 5. The resist 51A formed along the outer periphery of the sealing substrate 3 is configured to mask the outside of the finally-formed concave portion 3A.

Two-stage etching as described above enables a deep etching at the sacrifice of some accuracy in etching position in the first etching process, and a shallow etching with improved accuracy in positioning of the bottom face 5A of the supporting projection 5 and the outer periphery of the concave portion 3A in the second etching process, respectively.

When forming the concave portion 3A and the supporting projection 5 only by the first process of etching, the deep etching may lower the accuracy in positioning the bottom face 5A of the supporting projection 5. Further, the deep etching may result in a comparatively small flat surface for placing the drying agent 6 with a gradually tapered etching along the outer periphery of the concave portion 3A. On the other hand, when improving the accuracy in positioning the bottom face 5A of the supporting projection 5 only by a single process of etching, the deep etching becomes difficult to secure a desired volume for the sealing space.

The above-mentioned two-stage etching including the first and the second etching processes combines a deep etching intended for the depth and a shallow etching intended for the positioning accuracy, thereby providing an accurate positioning for the bottom face 5A of the supporting projection 5 and increasing the strength of the supporting projection 5 with a thick foot, and moreover narrowing the marginal width of the organic EL panel 10 with a steeply tapered outer periphery of the concave portion 3A.

The supporting projection 5 may be formed not only by the above etching processes (wet etching processes), but by grinding processes such as dry etching or sandblasting. Alternatively, the supporting projection 5 may be formed by forming a convex portion on a flat surface of the sealing substrate 3 through a deposition process such as CVD (Chemical Vacuum Deposition).

Figure 11:
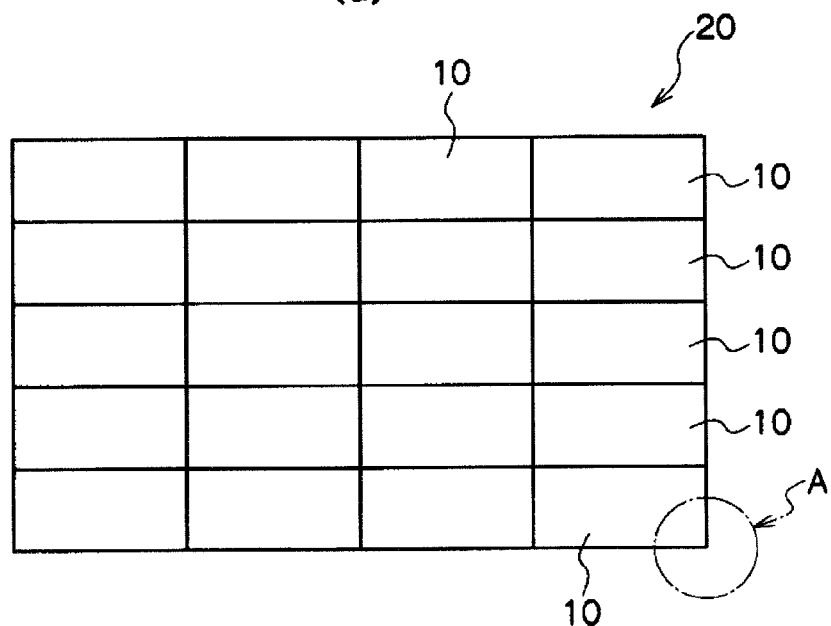
FIG. 11 is a view for illustrating a panel-combined light-emitting device 20 configured with a plurality of organic EL panels 10 planarly jointed to each other to make up a large-sized panel (FIG. 11(a) is a plan view of the panel-combined light-emitting device 20, FIG. 11(b) is an enlarged view of A part in FIG. 11(a).
Figure 11:
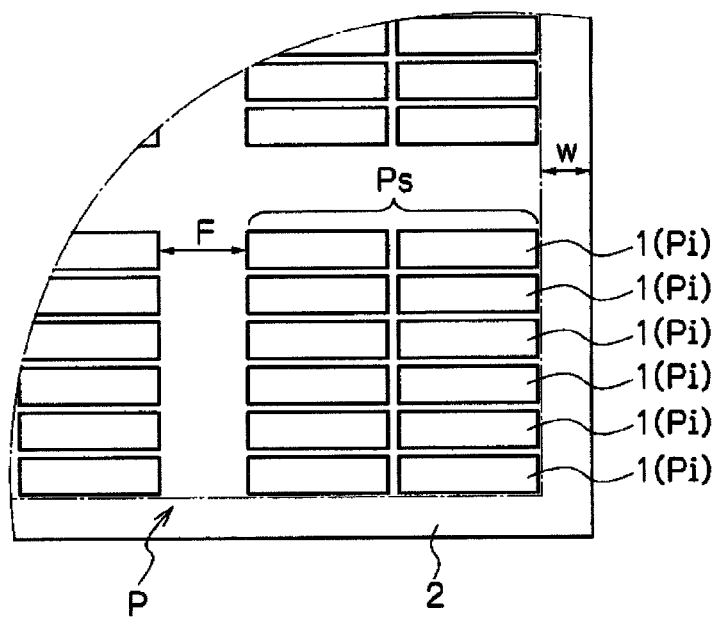

FIG. 11 is a view for illustrating a panel-combined light-emitting device 20 configured with a plurality of organic EL panels 10 planarly jointed to each other to make up a large-sized panel (FIG. 11(a) is a plan view of the panel-combined light-emitting device 20, FIG. 11(b) is an enlarged view of part A in FIG. 11(a). The structure of the respective organic EL panel 10 has been described above. Each of the organic EL panels 10 is connected to the adjacent organic EL panels 10 with the left, right, top and bottom of the lateral face being faced to each other.

The panel-combined light-emitting device 20 has a plurality of organic EL panels 10 planarly jointed to each other as shown in FIG. 11(a), producing a single or plural display screens by combining the display screens of the respective organic EL panel 10. The display screen P of the respective organic EL panel 10 is formed with a collection of plural pixels Pi as shown in FIG. 11 (b), and is adapted to enable color displaying by appropriately dispersing the organic EL elements 1 emitting different color lights such as R, G and B. The display screen P of the each organic EL panel 10 includes a plurality of pixel blocks Ps. Each of the blocks Ps is located at a predetermined distance of F from the adjacent blocks. The distance F is adapted to be approximately two times larger than the marginal width w of the individual organic EL panel 10. Although the joint lines between adjacent organic EL panels 10 form a non-display part that is twice as large as the marginal width w corresponding to the light emitting part P between adjacent organic EL panels, the joint lines can be configured to be less recognizable by providing a distance of about 2 w between respective pixel blocks Ps.

Figure 12:
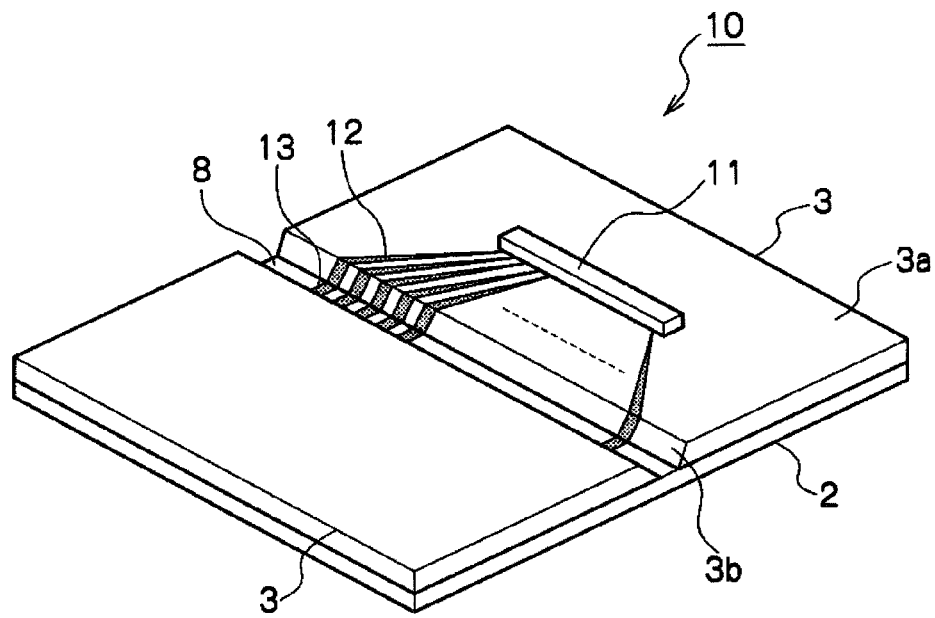
FIGS. 12(a) and 12(b) are views illustrating an example of the interconnect structure of respective organic EL panels in the panel-combined light-emitting device according to one embodiment of the present invention.
Figure 12:
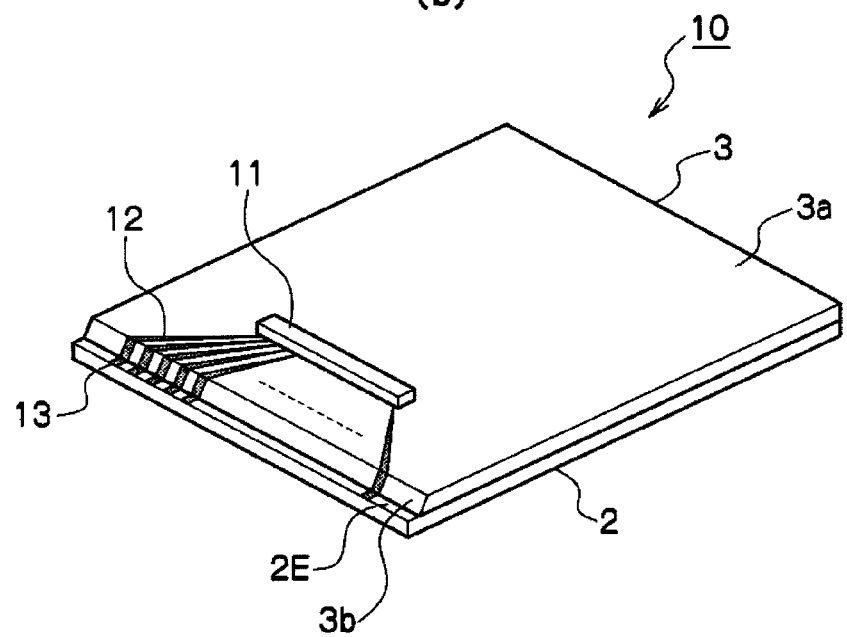

FIG. 12 is a view for illustrating an example of the interconnect structure of respective organic EL panels in the panel-combined light-emitting device 20. In an example shown in FIGS. 12(a) and 12(b), a drive IC 11 is provided on the upper surface 3a of the sealing substrate 3 and a lead wire 12 is provided on the upper surface 3a and the lateral surface 3b of the sealing substrate 3. The lateral surface 3b on which the lead wire 12 is provided is formed to be tapered. A lead wire 13 (a lead wire from anode or cathode of the organic EL element 1) on the surface of the panel substrate 2 where the organic EL element 1 is formed and to the lead wire 12 on the sealing substrate 3 are connected to each other when bonding the panel substrate 2 and the sealing substrate 3 together. Being connected to the lead wire 12 on the sealing substrate 3, the drive IC 11 is connected to the organic EL element 1 through the lead wires 12 and 13. In an example shown in FIG. 12 (a), two sealing substrates 3, 3 are bonded to the panel substrate 2 to form an exposed portion 8 between the sealing substrates 3, 3. The lead wire 13 from the organic EL element 1 that is sealed by the sealing substrates 3, 3 is provided on the exposed portion 8 of the panel substrate 2. In an example shown in FIG. 12(b), one sealing substrate 3 is bonded to the panel substrate 2 to make an exposed portion 2E on the end of the panel substrate 2. The lead wire 13 from the organic EL element 1 that is sealed by the sealing substrate 3 is provided on the end portion 2E on the end of the panel substrate 2.

According to the above-mentioned panel-combined light-emitting device 20, the joint lines of the organic EL panel 10 may be made less recognizable by setting the distance between the pixel blocks Ps being defined in accordance with the distance (2 w) between the adjacent light-emitting parts P. Further, the above-mentioned supporting margin F being formed in the margin between the pixel blocks Ps allows to effectively provide the supporting projection 5 on the sealing substrate 3 such that the supporting projection 5 comes into contact with the supporting margin F, which may improve overall display qualities in the panel-combined light-emitting device 20. Accordingly, the panel-combined light-emitting device 20 makes it possible to prevent the drying agent 6 from inconveniently contacting the organic EL elements 1 while maintaining the high display performance, thereby enabling to maintain a high durability even when thin or large-sized display screens are pursued.

Although the embodiments of the present invention are described in detail with reference to the drawings, the specific embodiments are not limited to those described above. The scope of the present invention is intended to include all equivalents and modifications without departing from the subject matter of the present invention. Further, each of the embodiments described above may be combined to each other unless the purpose and structure are contradictory.

The invention claimed is:

1. An organic EL panel, comprising:
   a panel substrate;
   a light-emitting part including a plurality of organic EL elements having an anode, an organic layer and a cathode laminated on the panel substrate; and
   a sealing substrate configured to be bonded onto the panel substrate through an adhesive layer to hollow-seal the light-emitting part, wherein
   the sealing substrate includes a supporting projection projecting toward the panel substrate,
   the supporting projection is configured to be point-like, and
   a supporting margin facing a bottom face of the supporting projection is provided where organic EL elements are not formed within a region of the light-emitting part on the panel substrate,
   wherein
   the supporting projection is configured to project from an inner surface of a concave portion formed on the sealing substrate, and
   a drying agent is placed on the entire inner surface except the supporting projection without making a cutout.

2. The organic EL panel according to claim 1, wherein at least one cross-sectional shape of the supporting projection perpendicular to the panel substrate is configured to be wider near the sealing substrate than on the bottom face near the panel substrate.

3. The organic EL panel according to claim 2, wherein
   a sealing space configured with the panel substrate and the sealing substrate is set to have a lower pressure than the atmospheric pressure, and
   the bottom face of the supporting projection is configured to come into contact with the supporting margin directly or through a member.

4. The organic EL panel according to claim 2, wherein
the light-emitting part is configured with a plurality of pixel blocks, each of which has a plurality of organic EL elements, and
the supporting margin is configured between the pixel blocks.

5. The organic EL panel according to claim 1, wherein
a sealing space configured with the panel substrate and the sealing substrate is set to have a lower pressure than the atmospheric pressure, and
the bottom face of the supporting projection is configured to come into contact with the supporting margin directly or through a member.

6. The organic EL panel according to claim 1, wherein a height of the supporting projection from an inner surface of the sealing substrate is configured to be greater than a thickness of a drying agent placed on the inner surface of the sealing substrate.

7. The organic EL panel according to claim 6, wherein at least one cross-sectional shape of the supporting projection perpendicular to the panel substrate is configured to be wider near the sealing substrate than on the bottom face near the panel substrate.

8. The organic EL panel according to claim 7, wherein
a sealing space configured with the panel substrate and the sealing substrate is set to have a lower pressure than the atmospheric pressure, and
the bottom face of the supporting projection is configured to come into contact with the supporting margin directly or through a member.

9. The organic EL panel according to claim 7, wherein
the light-emitting part is configured with a plurality of pixel blocks, each of which has a plurality of organic EL elements, and
the supporting margin is configured between the pixel blocks.

10. The organic EL panel according to claim 1, wherein
the light-emitting part is configured with a plurality of pixel blocks, each of which has a plurality of organic EL elements, and
the supporting margin is configured between the pixel blocks.

11. A panel-combined light-emitting device having a plurality of organic EL panels planarly jointed to each other to make a large-sized panel, the organic EL panel comprising:
a panel substrate;
a light-emitting part including a plurality of organic EL elements having an anode, an organic layer and a cathode laminated on the panel substrate; and
a sealing substrate configured to be bonded onto the panel substrate through an adhesive layer to hollow-seal the light-emitting part, wherein
the sealing substrate includes a supporting projection projecting toward the panel substrate,
the supporting projection is configured to be point-like,
a supporting margin facing a bottom face of the supporting projection is provided where organic EL elements are not formed within a region of the light-emitting part on the panel substrate,
the light-emitting part is configured with a plurality of pixel blocks, each of which has a plurality of organic EL elements, while the supporting margin is configured between the pixel blocks, and
distance between the pixel blocks is defined in accordance with distance between the adjacent light-emitting parts of the organic EL panels,
wherein
the supporting projection is configured to project from an inner surface of a concave portion formed on the sealing substrate, and
a drying agent is placed on the entire inner surface except the supporting projection without making a cutout.

* * * * *